United States Patent [19]

Tigelaar et al.

[11] Patent Number: 5,451,810
[45] Date of Patent: Sep. 19, 1995

[54] METAL-TO-METAL ANTIFUSE STRUCTURE

[75] Inventors: Howard L. Tigelaar, Allen; George Misium, Plano, both of Tex.

[73] Assignee: Texas Instruments Incorporated, Dallas, Tex.

[21] Appl. No.: 166,429

[22] Filed: Dec. 14, 1993

Related U.S. Application Data

[62] Division of Ser. No. 79,194, Jun. 17, 1993, Pat. No. 5,300,456.

[51] Int. Cl.6 .................... H01L 29/04; H01L 27/02; H01L 23/48
[52] U.S. Cl. ........................... 257/530; 257/50; 257/528; 257/529; 257/635; 257/758; 257/760
[58] Field of Search ........... 257/50, 528, 529, 530, 257/758, 760, 635; 437/195

[56] References Cited

U.S. PATENT DOCUMENTS

| | | | |
|---|---|---|---|
| 5,100,827 | 3/1992 | Lytle | 437/52 |
| 5,171,715 | 12/1992 | Husher et al. | 437/195 |
| 5,181,096 | 1/1993 | Forouhi | 257/50 |

*Primary Examiner*—Rolf Hille
*Assistant Examiner*—Valencia Martin Wallace
*Attorney, Agent, or Firm*—Jacqueline J. Garner; Richard L. Donaldson; William E. Hiller

[57] ABSTRACT

A method of forming a metal-to-metal antifuse. An antifuse stack 32 is formed comprising a first metal layer 16, an antifuse dielectric layer, and an etchstop layer. The etchstop layer may, for example, comprise an oxide layer 24 and an amorphous silicon layer 28. An antifuse via 44 is etched through an interlevel dielectric layer 36 to the antifuse stack 32. Next, a portion of the etchstop layer at the bottom of via 44 is removed. Finally, a second layer of metal 48 is deposited to fill antifuse via 44 and etched to form the desired interconnections.

7 Claims, 3 Drawing Sheets

METAL-TO-METAL ANTIFUSE STRUCTURE

This is a division of application Ser. No. 08/079,194, filed Jun. 17, 1993, now U.S. Pat. No. 5,300,456.

FIELD OF THE INVENTION

This invention generally relates to antifuse cells and more specifically to metal-to-metal antifuse structures.

BACKGROUND OF THE INVENTION

Antifuse cells conventionally comprise a decoupling element, such as a PN junction diode, and an antifuse element electrically connected in series with a blocking element. Initially, the antifuse exists in a nonconductive state. To program the memory cell, a voltage is selectively impressed across it to activate the antifuse (off state) and thereafter cause the antifuse to exist in a high conductive state (on state).

SUMMARY OF THE INVENTION

One prior art construction is a memory cell having an antifuse element comprising amorphous silicon interposed between Titanium-Tungsten (TiW) electrodes in a Via type structure. To build this structure, the bottom TiW is deposited and then buried under oxide dielectric. A Via opening is then etched through the oxide stopping on the bottom TiW layer, Amorphous silicon is then deposited into the Via opening and a top TiW electrode layer deposited and etched. There are two difficulties with this method. First the breakdown voltage of the antifuse is very sensitive to both the size of the antifuse openeing and also the depth. The voltage depends upon the thickness of the amorphous silicon in the bottom of the via hole and this thickness varies with antifuse opening size and the depth of the via hole. The second problem is that the Via antifuse structure is not very scalable to smaller dimensions. As the technology scales to smaller design rules the antifuse opening must become smaller so the aspect ratio increases. Amorphous silicon is a PECVD (plasma enhanced chemical vapor deposition) process. Because of step coverage problems it becomes increasingly difficult to get the PECVD film into the bottom of deeper openings. The following disclosure overcomes both these issues.

Generally, and in one form of the invention, a method of forming an antifuse structure on a semiconductor device is disclosed. A first conducting layer is deposited on the semiconductor device. A dielectric layer is deposited over the first conducting layer. The dielectric layer may comprise amorphous silicon. An etchstop layer is then deposited over the dielectric layer. The etchstop layer may, for example, comprise a layer of oxide and a layer of amorphous silicon. Next, the etchstop layer, dielectric layer, and first conducting layer are etched to form an antifuse stack. Next, an interlevel oxide is deposited. Vias are etched in the interlevel dielectric layer to expose a portion of the first conducting layer and a portion of the antifuse stack. One via extends through the interlevel dielectric layer to the semiconductor device and another via, the antifuse via, extends through the interlevel dielectric layer to the antifuse stack. The portion of the etchstop layer located in the antifuse via is removed to expose a portion of the dielectric layer. Next, a second conducting layer is deposited over the interlevel dielectric layer, the exposed portion of the first conducting layer and the exposed portion of the dielectric layer such that the second conducting layer fills the vias. The second conducting layer is then etched to form the desired interconnections.

An advantage of the invention is providing antifuse structures having reduced variation in breakdown voltage, because the antifuse dielectric is deposited on a fiat conducting layer as opposed to deposition in a via hole as in the prior art.

A further advantage of the invention is providing a method of forming an antifuse structure that can etch through various thickness of ILO without damaging the antifuse dielectric.

A further advantage of the invention is providing a metal-to-metal antifuse structure having a minimum size.

These and other advantages will be apparent to those of ordinary skill in the art having reference to this specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiments of the invention will be described in conjunction with a CMOS process. It will be apparent to those skilled in the art that the invention may be used with other processes, such as BiCMOS processes, which may also realize the benefits thereof. The preferred embodiments will be described as formed on a semiconductor device after the formation of transistors and the like and after the formation of the second metal interconnect level. It will be apparent to those skilled in the art that the invention may instead be formed after any conducting or interconnect layer, such as the first metal interconnect level.

Figure 1:
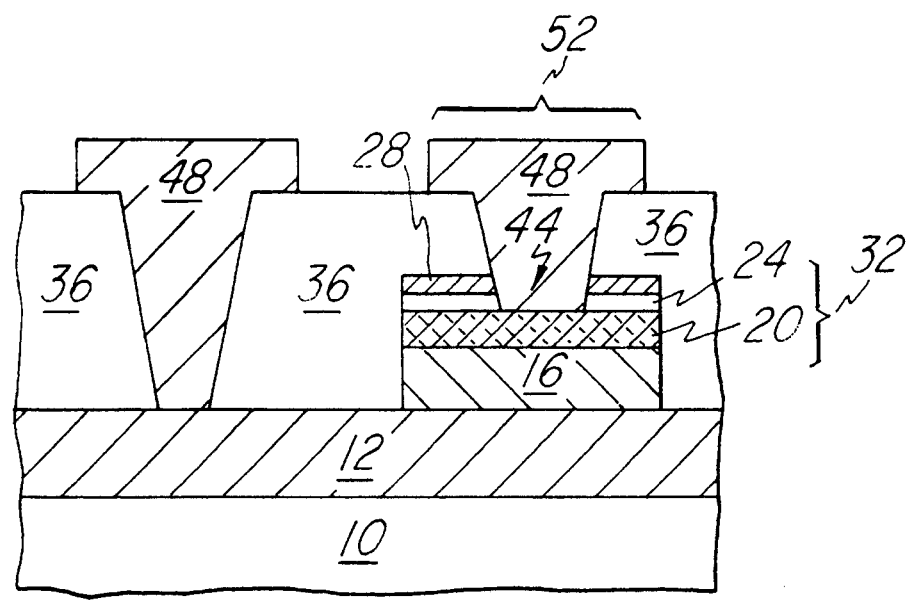
FIG. 1 is a cross-sectional diagram of a metal-to-metal antifuse structure according to the,first preferred embodiment of the invention.

A metal-to-metal antifuse according to the first preferred embodiment of the invention is shown in FIG. 1. Antifuse 52 is located above device 10. Device 10 may, for example, be a CMOS device processed through the deposition of METAL 2 (shown here as metal interconnect layer 12) and may contain, for example, transistors and other elements. Inter-level oxide layer 36 insulates portions of metal interconnect layer 12 where interconnections are not desired. Antifuse 52 comprises conducting layer 16, dielectric layer 20, and metal interconnect layer 48. Conducting layer 16 may, for example, comprise titanium-tungsten (TiW), titanium-nitride (TIN), or titanium (Ti). It serves as the bottom plate of antifuse 52. Dielectric layer 20 serves as the antifuse dielectric and may, for example comprise amorphous silicon. Interconnect layer 48 contacts antifuse stack 32 through antifuse via 44. Interconnect interconnect layer 48 also forms the top plate of the antifuse 52. The electrical size of an antifuse is determined by the minimum geometry of the structure. In this case, the electrical size is determined by the diameter of antifuse via 44. A small electrical size is desired because a larger electrical size results in higher capacitance. The amount of capacitance determines the antifuse charge-up time. As the capacitance increases so does the charge-up time. Conducting layer 16, dielectric layer 20, oxide layer 24 and amorphous silicon layer 28 form antifuse stack 32. The reasons for forming antifuse stack 32 are process related and will be described herein below.

Figure 2A:
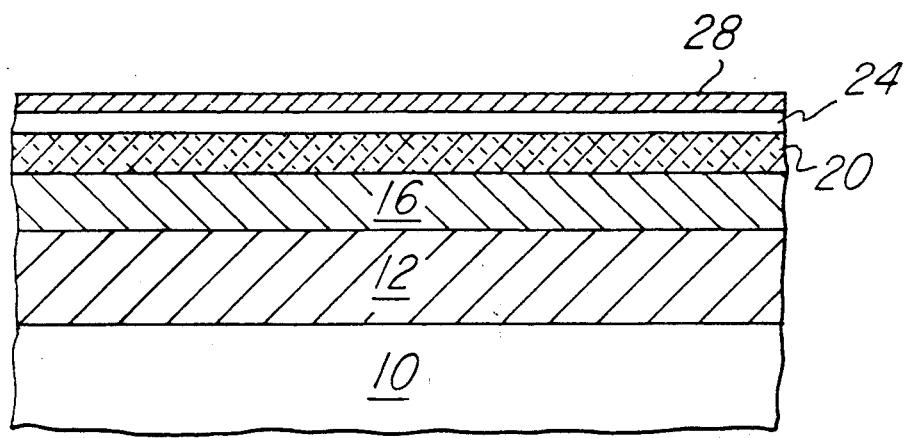
FIGS. 2a–e are cross-sectional diagrams of the structure of FIG. 1 at various stages of fabrication.

Referring to FIG. 2a, the formation of the first preferred embodiment of the invention begins with depositing a layer of conducting material 16 to a thickness of approximately 3000 Å A over metal interconnect layer 12, which in turn covers device 10. As discusses above, metal interconnect layer 12 is the second interconnect level commonly referred to as Metal 2 in semiconductor processing and device 10 may comprise transistors (not shown) and other elements (also not shown) found in a typical CMOS device. Preferably, conducting layer 16 comprises titanium-tungsten (TiW). However, conducting layer 16 may comprise any metal which does not react with amorphous silicon or aluminum-silicon-copper (AlSiCu), such as titanium-nitride (TIN). Conducting layer 16 will form the bottom plate of the antifuse. It should be noted that conducting layer 16 and metal interconnect layer 12 may both comprise TiW and may be combined to form a barrier layer.

Figure 2B:
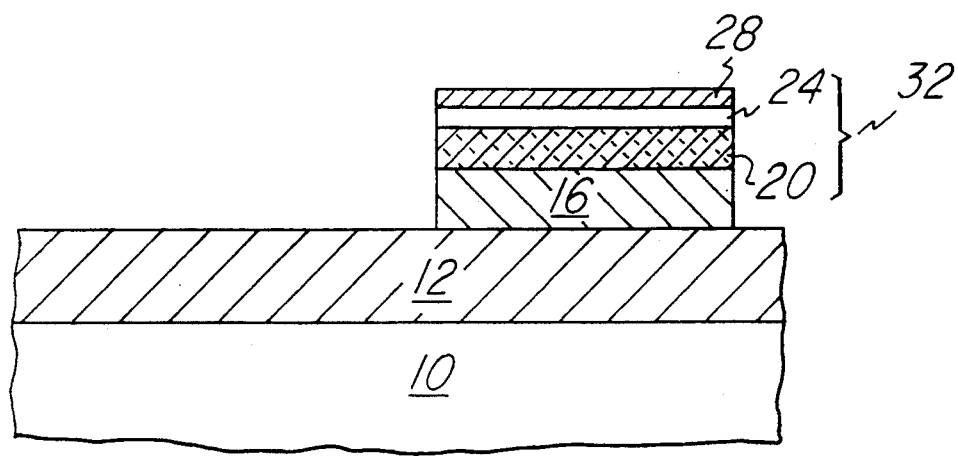

Next, a layer of dielectric material 20 is deposited, for example by plasma enhanced chemical vapor deposition (PECVD), to a thickness of 1000 Å. In the preferred embodiment, dielectric layer 20 comprises amorphous silicon. However, it will be apparent to those skilled in the art that other dielectrics may alternatively be used. This is followed with a deposition of oxide layer 24. Oxide layer 24 may also be deposited by PECVD and may have a thickness on the order to 500 Å. Finally, a second layer of amorphous silicon 28 is deposited, preferably by PECVD, to a thickness on the order of 500 Å. Oxide layer 24 and amorphous silicon layer 28 are dummy processing layers that have no electrical function in the antifuse. Referring to FIG. 2b, conducting layer 16, dielectric layer 20, oxide layer 24 and amorphous silicon layer 28 are patterned and etched by conventional techniques to form the antifuse stack 32. It should be noted that at this point metal interconnect layer 12 may be patterned and etched (not shown) to form the interconnections desired for device 10.

Figure 2C:
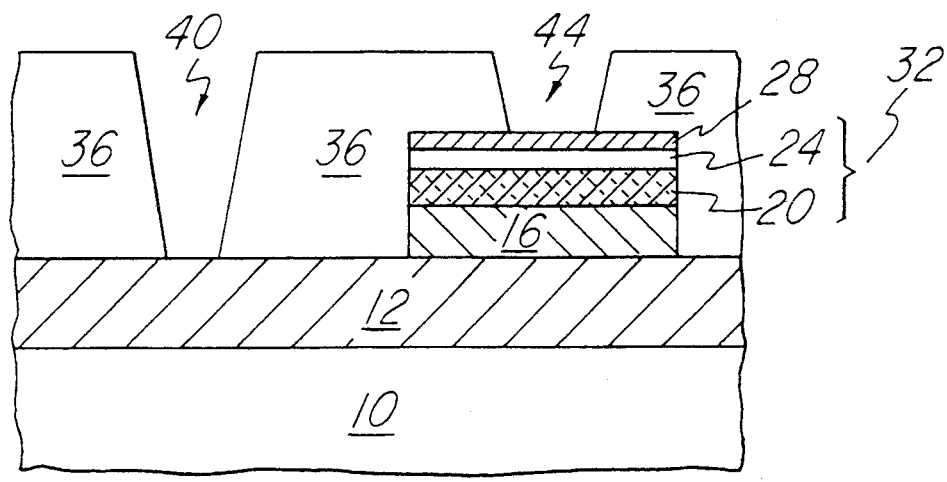

Referring to FIG. 2c, interlevel oxide (ILO) 36 is deposited and planarized by conventional techniques. Next, ILO 36 is patterned and selectively etched to form via 40 and antifuse via 44. Via 40 will extend through ILO 36 to metal interconnect layer 12. The antifuse via 44 will extend through ILO 36 to amorphous silicon layer 28. The oxide etch stops on amorphous silicon layer 28. However, a portion of amorphous silicon layer 28 will be removed. Thus, variations in the thickness of ILO 36 will result in damage to amorphous silicon layer 28 and not to the antifuse dielectric, dielectric layer 20.

Figure 2D:
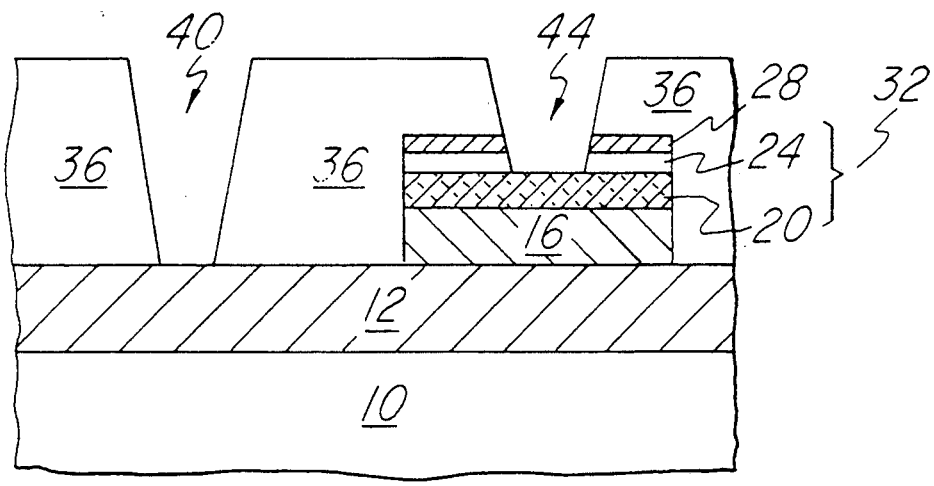
Figure 2E:
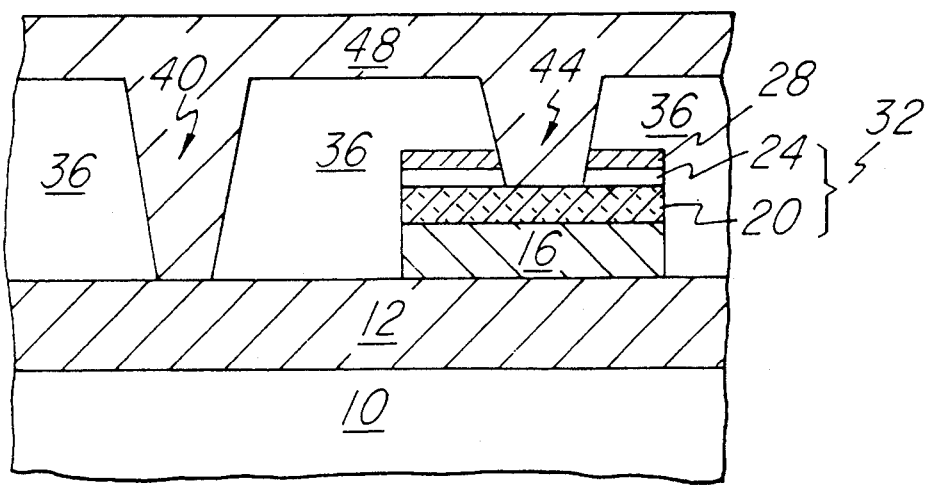

Referring to FIG. 2d, amorphous silicon layer 28 is selectively etched away at the bottom of the antifuse via 44. This etch is selective relative to oxide such that the etch stops on oxide layer 24. Such etches are well known in the art. Next, oxide layer 24 is etched to remove the portion of oxide layer 24 at the bottom of the antifuse via 44. Because oxide layer 24 is relatively thin and of constant and known thickness, only minimal damage to dielectric layer 20 occurs. Next, interconnect layer 48 is deposited over the surface of the structure, as shown in FIG. 2e. Interconnect layer 48 extends through via 40 to make contact to metal interconnect layer 12 and through antifuse via 44 to dielectric layer 20. Finally, interconnect layer 48 is patterned and etched as shown in FIG. 1.

Figure 3:
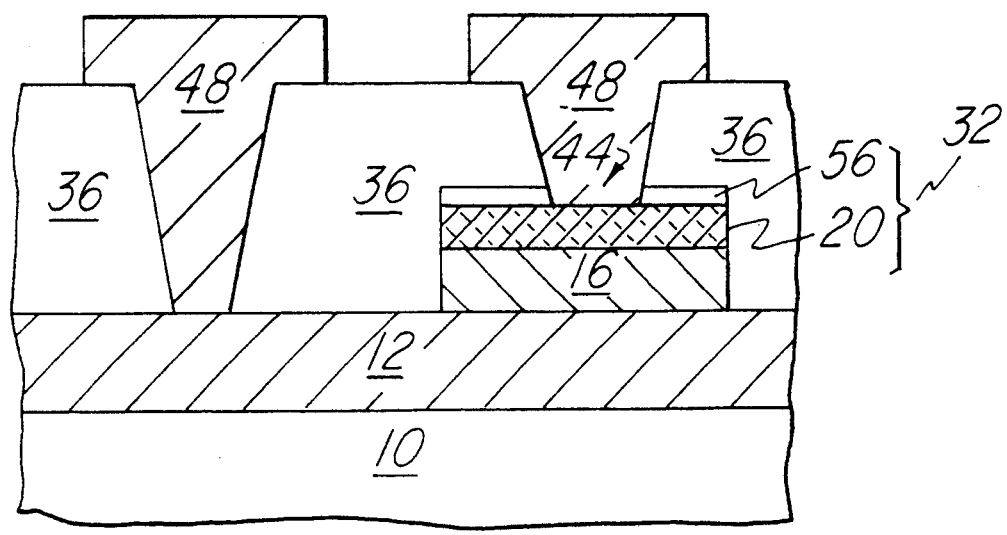
FIG. 3 is a cross-sectional diagram of a metal-to-metal antifuse structure according to the second preferred embodiment of the invention.
Figure 4:
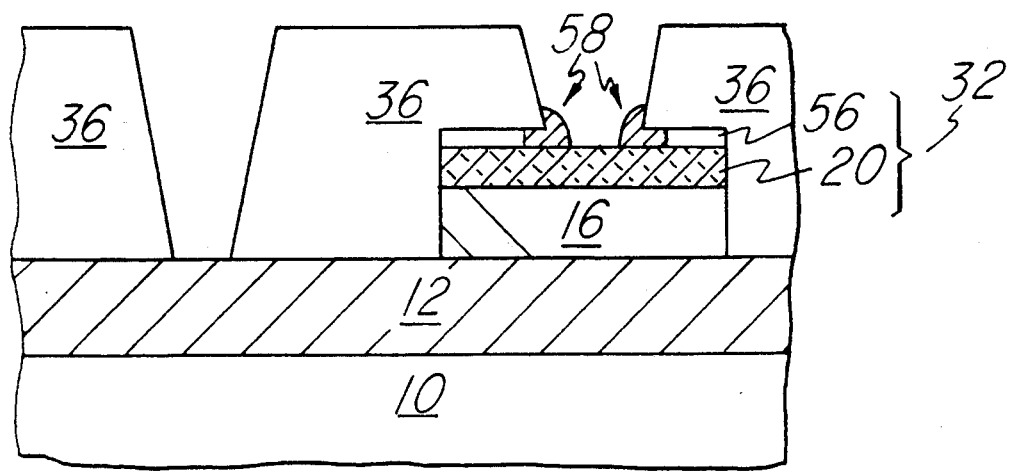
FIG. 4 is a cross-sectional diagram of an alternative second preferred embodiment of the invention showing a recessed aluminum layer and sidewall.

A metal-to-metal antifuse according to a second preferred embodiment of the invention is shown in FIG. 3. FIG. 3 is identical to FIG. 1 except that oxide layer 24 and amorphous silicon layer 28 are replaced with conductor layer 56. Conductor layer 56 preferably comprises aluminum or aluminum-oxide, but may comprise any material which forms a good etchstop layer relative to oxide at a thickness on the order of 100 Å. The structure of FIG. 3 may be formed as described above relative to FIGS. 2a-f with a deposition of conductor metal replacing the deposition of oxide layer 24 and amorphous silicon layer 28. If aluminum-oxide is desired, it may be deposited by the sputter deposition of aluminum-oxide or by depositing aluminum and the oxidizing it. Alternatively, if conductor layer 56 comprises aluminum, after conductor layer 56 at the bottom of antifuse via 44 is etched it may be turned into an insulator by either heating the device to a temperature of about 400° C. or via a chemical reaction with the top of the dielectric layer 20. In another method, the etch of conductor layer 56 may be extended until the edges of conductor layer are recessed away from the antifuse via 44, as shown in FIG. 4. This may be followed by the formation of sidewall oxides 58 to isolate conductor layer 56 from metal interconnect layer 48.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A metal-to-metal antifuse structure located on a semiconductor device comprising.
   a. an antifuse stack located on said semiconductor device comprising:
      i. a bottom plate comprising conductive material adjacent said semiconductor device;
      ii. an antifuse dielectric comprising amorphous silicon located on said bottom plate; and
      iii. an etchstop layer located above said antifuse dielectric;
   b. an interlevel dielectric located above said semiconductor device and said antifuse stack;
   c. at least one via extending through said interlevel dielectric and said etchstop layer to said antifuse dielectric; and
   d. a top plate comprising conductive material and located adjacent said antifuse dielectric in said at least one via, wherein an electrical size of said metal-to-metal antifuse structure is determined by said top plate.

2. The structure of claim 1 wherein said bottom plate and said top plate comprise TiW.

3. The structure of claim 1 wherein said bottom plate and said top plate comprise TiN.

4. The structure of claim 1 wherein said etchstop layer comprises aluminum.

5. The structure of claim 1 wherein said etchstop layer comprises aluminum-oxide.

6. The structure of claim 1 wherein said etchstop layer comprises a layer of oxide adjacent said dielectric layer and a layer of amorphous silicon overlying said oxide layer.

7. The structure of claim 1 wherein said bottom plate and said top plate comprise titanium.

* * * * *